United States Patent Office 3,409,432

Patented Nov. 5, 1968

3,409,432

CHEMICAL AMPLIFICATION OF PHOTOSENSITIVE LAYERS

Paul B. Gilman, Rochester, N.Y., assignor to Eastman Kodak Company, Rochester, N.Y., a corporation of New Jersey No Drawing. Filed Oct. 24, 1965, Ser. No. 504,993

14 Claims. (Cl. 96—48)

ABSTRACT OF THE DISCLOSURE

A silver image on a copper surface is obtained from an exposed photosensitive layer comprising ferric nitrate and potassium bromide by contacting the exposed layer with a physical developing solution containing a silver salt and a silver halide developing agent.

This invention relates to a novel method for image amplification of light-sensitive copper or copper alloy surfaces or plates, and more particularly to a method of producing visible silver images by physical development after exposure of such light-sensitive plates.

It is well known that copper salts are light-sensitive and useful for obtaining direct print-out images on copper and high-copper alloy surfaces. For example, it has been proposed to employ a solution of ferric nitrate and potassium bromide to make copper plates sensitive to light (Kodak Data Book P–7, "Kodak Photosensitive Resists for Industry," p. 38 (1962), published by Eastman Kodak Company). Such photosensitive plates have been found to be particularly useful, for example, for producing routine guides for photoengravings, name plates, decorative purposes, and the like. To obtain print-out images of satisfactory visibility and sharpness, it has been found necessary in the above process to employ a relatively high light level over a considerable period of time, for example up to 10 minutes or even more in some cases, in the contact printing step. Another factor which has presented some difficulty has been the tendency of the copper plates to continue printing out, so that after about 30 minutes of use under normal conditions, only traces remain of the original print-out images. These and other shortcomings have tended to limit the utility of the known copper print-out processes.

I have now made the discovery that the aforementioned shortcomings of the prior art processes can be effectively overcome and improved upon by physical development of exposed copper plates which have been photosensitized with ferric nitrate-potassium bromide solution. The physical development step amplifies the effect of light so that exposures of about one-tenth those required for producing print-out images are made possible. The phyiscal development step also makes possible the production of excellent quality silver images with but a single exposure step, as well as promoting the stability of the photosensitive plate to further print-out. Once the silver image has been deposited, the copper no longer continues to print-out on continued exposure to light. Thus, the advantages of the process of my invention include (1) a single exposure step, (2) increased sensitivity and (3) stabilization of the image.

It is, accordingly, an object of the invention to provide a novel process for the production of superior photographic images on photosensitized copper or high-copper alloy surfaces.

Another object is to provide a novel physical development procedure for the above process which reduces the light level necessary to register a visible image on a photosensitive copper or high-copper alloy plate, which gives an excellent silver image thereon with but a single exposure step, and which stabilizes the exposed and developed photosensitive plate to further print-out on continued exposure to light.

Other objects will become apparent hereinafter.

In accordance with the invention, I carry out my novel process by first preparing a photosensitive copper surface or plate. Any smooth and clean copper or high-copper alloy surface can be effectively used, for example, a polished copper or brass plate. Prior to sensitization, the plate is degreased in any vapor degreaser or by other suitable means, followed by rubbing with pumice or treating with chemical reagents and immersing in dilute hydrochloric acid for about 10 seconds, or more as desired, at room temperature. Dry buffing can also be used as an alternate cleaning method. The plate is then rinsed in water and dried.

The photosensitizing composition comprising ferric nitrate and potassium bromide is next applied to the plate prepared as above by any known means of application such as spraying, painting, dipping, etc. The ratio of ferric nitrate to potassium bromide and the total concentration of these components in water can vary over wide limits, but preferably coming within the following formulation:

| Photosensitizing composition: | Grams |
|---|---|
| Ferric nitrate $Fe(NO_3)_3\cdot 9H_2O$ | 35–140 |
| Potassium bromide | 30–120 |
| Water to make, a total of 1,000 ml. | |

The ferric nitrate-potassium bromide solution produces a yellowish haze on the surface of the copper, when dried, so that a material having light absorption in the wavelength range of from about 400 to 420mμ. Wedge spectrograms of the sensitized copper plates show a sensitivity peak at from 400 to 420mμ. Further details of the preparation of the above described photosensitive plates can be had by reference to the aforementioned Kodak Data Book P–7, published by Eastman Kodak Company.

To prepare the silver image plates of the invention, a photosensitive copper or high-copper alloy plate prepared as above described is exposed in contact through a line drawing or other image pattern to be reproduced to a suitable light source such as a carbon arc, a mercury vapor lamp or other high energy sources rich in radiation in the region of the spectrum of wavelengths of about 280 to 450 mμ. The period of exposure can vary quite widely, for example, about from 1 second to several minutes or more depending on the light source and its distance from the plate and on the desired qualities of the resulting image. The mechanism of the formation of the latent image which results at low exposures is not known. However, electron diffraction patterns of the black print-out image material indicate the presence of cuprous bromide. One possibility is that the ferric ion oxidizes the bromide to bromine in the presence of the copper. Exposure to light then produces cuprous bromide which initially acts as a reducing agent for silver in the physical developer. Subsequently amplification results from continued deposition of silver by normal physical development on the silver reduced by the photoproduced cuprous bromide.

The exposed plate is then subjected to physical development. This may be accomplished by use of an alkaline solvent developer comprising as essential components both a silver halide solvent and a silver halide developing agent, in conjunction with a source of silver halide as in an unexposed photographic silver halide element. For this purpose, a piece of unexposed photographic film, for example, is wetted for a period of about from 2 seconds to 2 minutes with the solvent developer and then put into contact with the exposed plate. In a short time metallic silver is deposited in the exposed areas of the plate. After full development, the film or paper is peeled from the plate, leaving a shiny silver image thereon. The plate is then washed and dried. The contact time can vary quite widely, but preferably from about 10 seconds to 5 minutes, or even longer, although no particular advantage is gained by prolonging the contact period beyond that required for full development of the image.

Suitable solvent transfer developers for carrying out the process of the invention include any of those which contain both a silver halide solvent, e.g., an alkali metal thiosulfate, ammonium thiosulfate, an alkali metal thiocyanate, ammonium thiocyanate, sodium sulfite, etc., and a silver halide developing agent, e.g., N-monomethyl-p-aminophenol sulfate; dihydroxybenzene; hydroquinone; certain hydroquinone compounds (e.g., chlorohydroquinone, dichlorohydroquinone, bromohydroquinone, etc.); 1-phenyl-3-pyrazolidone and its derivatives; triaminophenols; and the like.

Suitable unexposed photographic film or papers for carrying out the process of the invention include any of the conventional materials comprising a suitable film support material, e.g., cellulose esters, such as cellulose nitrate, cellulose acetate, cellulose acetate-propionate, etc., polystyrene, polyesters such as polyethylene terephthalate, etc., polyethylene, polypropylene, polyamides, paper, glass, metal, and the like, having thereon a gelatino silver halide developing-out emulsion layer, e.g., gelatino silver chloride, -chlorobromide, -chloroiodide, -chlorobromoiodide, -bromide and -bromoiodide. However, similar materials wherein the gelatin is replaced with other carriers such as, for example, collodion, albumin, polyvinyl alcohol, polyvinyl pyrrolidone, etc., can also be used effectively. The emulsion layers can also contain sensitizers or other addenda for improving the character of the emulsion layer as is well known in the art.

A particularly useful solvent transfer developer for carrying out the process of the invention has the following formulation:

Solvent transfer developer—

| | | |
|---|---|---|
| Methylaminoethanol-$SO_2$ (18.9% $SO_2$) | g | 95–400 |
| Hydroquinone | g | 6–24 |
| 1-phenyl-4,4-dimethyl pyrazolidone | g | 0.5–2 |
| Sodium thiosulfate pentahydrate | g | 30–120 |
| Potassium iodide | g | 0.2–0.6 |
| 1% methanol solution of 5-methyl-3-piperidinylmethyl-2-thiooxazolidone | ml | 10 |
| Water to make a total of 1,000 ml. | | |

In the above formulation, the methylaminoethanol-$SO_2$ component can be replaced with any other of the conventional bases used in photographic developers, e.g., sodium or potassium hydroxide. The essential hydroquinone and sodium thiosulfate pentahydrate components can also be replaced with any of the mentioned developing agents for silver halide and the mentioned silver halide solvents, respectively. The use of 1-phenyl-4,4-dimethyl pyrazolidone, potassium iodide or the toning agent 5-methyl-3-piperidinylmethyl-2-thiooxazolidine is optional. In any case, the above formulation and modifications thereof as indicated give highly satisfactory image results in the process of the invention.

The following examples will serve further to illustrate the manner of practicing my invention.

Example 1

A 5 x 7 clean copper plate was immersed for 5 seconds in a solution having the following composition:

| | G. |
|---|---|
| Ferric nitrate $Fe(NO_3)_3 \cdot 9H_2O$ | 68.7 |
| Potassium bromide | 59.5 |
| Water to make a total of 1,000 ml. | |

it was then rinsed with water and dried with hot air.

The above photosensitized plate was then exposed through a line image at a distance of 3 feet, for 1 minute, to a carbon arc to produce a print-out image. The exposed areas become visible as a positive; that is, an image appears where light has struck. Such a print-out image is stable under normal conditions for about 30 minutes. After this time the entire plate has printed out, leaving only a trace of the original exposure.

One-half of a plate exposed as above but kept in the dark was treated by the process of my invention to prevent print-out and make the image permanent. To do this, the print-out image was physically developed as follows. A strip of fine grain silver chlorobromide negative film was immersed for 3 seconds in a developer having the following composition:

| | | |
|---|---|---|
| Methylaminoethanol-$SO_2$ (18.9% $SO_2$) | g | 190 |
| Hydroquinone | g | 11.6 |
| 1-phenyl-4,4-dimethyl pyrazolidone | g | 1 |
| Sodium thiosulfate pentahydrate | g | 60 |
| Potassium iodide | g | 0.42 |
| 1% methanol solution of 5-methyl-3-piperidinyl-methyl-2-thiooxazolidone | ml | 10 |
| Water to make 1 l. | | |

The unexposed film was rolled in contact with the print-out image on the copper plate. After a 2-minute contact, the film was peeled from the plate, leaving a shiny positive silver image in the unexposed areas of the plate.

The original print-out image was produced on the whole plate, but only the area that was physically developed remained visible due to the fading of the print-out image with room-light handling.

Example 2

A second plate prepared as in above Example 1 was given a short exposure through a line image for 1 second to a No. 2 photoflood lamp at a distance of 12 inches. No visible print-out image was formed. (It takes at least 10 seconds under these exposure conditions to get a detectable print-out image; longer for a distinct one.)

When the plate with the 1-second exposure was rolled in contact with a piece of film as in Example 1, a dark visible image was formed, illustrating clearly that a physically developable latent image was present. Silver was deposited in the exposed areas.

Example 3.—Solution physical development of image

A copper plate, sensitized as in Example 1 was exposed to a line image as in Example 2. It was developed for 20 seconds in the following solution.

Part A:

| | | |
|---|---|---|
| Water | cc | 800 |
| Sodium sulfite | g | 20 |
| Sodium isoascorbate | g | 26 |
| Sodium carbonate·$H_2O$ | g | 50 |
| Hyamine 2744 (1% in $H_2O$) | cc | 20 |
| pH | | 11.0 |
| Water to 1 liter. | | |

Part B:

| | | |
|---|---|---|
| Water | cc | 800 |
| Sodium thiosulfate·$5H_2O$ | g | 30 |
| Silver chloride [1] (2 bottles) | moles | $5\times10^{-2}$ |
| 5-methylbenzatriazole (1% in dilute KOH) | cc | 40 |
| Water to 960 cc. | | |

For use: Mix Parts A and B 1:1.

[1] For making silver chloride:
(1) 42.4 g. $AgNO_3$ in 900 cc. of water.
(2) 42.4 g. KCl in 900 cc. of water.
(3) Mix 90 cc. of (1) and 90 cc. of (2) in a 6-ounce bottle.
(4) Let stand overnight, then pour off liquid for use.
Each bottle contains $2.5\times10^{-2}$ mole, therefore two bottles are required to make $5\times10^{-2}$ molar.
Hyamine 2744—octylphenoxyethoxyethyldimethyl-p-chlorobenzyl ammonium chloride.

A dense black silver image was deposited preferentially in the exposed areas of the copper plate. The background (non-exposed) areas showed some mirror-like surface reflectance. Thus, the developed plate would appear to be a negative or positive image depending on the orientation of the light use for viewing. The image area was clearly and readily discernible and could be readily distinguished from the background because of the difference in density and reflectance.

In the above examples, the process of the invention has been illustrated with the reproduction of images on photosensitized copper plates employing a specific solvent transfer developer. However, it will be understood that high-copper alloys, e.g., brass plate, can be similarly photosensitized and developed into positive silver images thereon. Also, that the specific solvent transfer developer can be replaced with any other photographic developers containing both a silver halide solvent and a silver halide developing agent, and more particularly with any developer coming within the formulation of the solvent transfer developer herein. Other of the mentioned unexposed photographic film materials can also be substituted in the above examples for the fine grain chlorobromide negative film to give generally similar results. Further, by replacing the line image to be reproduced with other appropriate image bearing transparencies, name plates, decorative designs, dials, guage faces, and the like, can be reproduced in accordance with the invention as positive silver images on copper or high-copper alloy surfaces or plates.

The invention has been described in detail with particular reference to preferred embodiments thereof, but it will be understood that variations and modifications can be effected within the spirit and scope of the invention as described hereinabove and as defined in the appended claims.

I claim:

1. A process for producing a silver image on a copper surface having a photosensitive layer thereon comprising ferric nitrate and potassium bromide which comprises (a) exposing said photosensitive layer and (b) contacting said exposed layer with a physical developing solution containing a silver salt and a silver halide developing agent.

2. The process of claim 1 wherein said contacting is carried out over a period of time of from about 10 seconds to 5 minutes.

3. The process of claim 2 wherein the said copper surface is a copper plate.

4. The process of claim 3 wherein the said silver halide developing agent is hydroquinone.

5. A process for producing a silver image on a copper surface having a photosensitive layer thereon comprising ferric nitrate and potassium bromide which comprises (a) exposing and photosensitive layer and (b) containing said exposed layer with an unexposed photographic silver halide containing element wetted with a solvent transfer developer comprising a silver halide solvent and a silver halide developing agent.

6. The process of claim 5 wherein said contacting is carried out over a period of time of from about 10 seconds to 5 minutes.

7. The process of claim 6 wherein the said copper surface is a copper plate.

8. The process of claim 7 wherein the said silver halide solvent is sodium thiosulfate.

9. The process of claim 7 wherein the said silver halide developing agent is hydroquinone.

10. The process of claim 7 wherein the said unexposed photographic element is a fine grain silver chlorobromide negative type film.

11. A process for producing a silver image on a copper plate having a photosensitive layer thereon of ferric nitrate-potassium bromide which comprises (a) exposing said layer to an image pattern and (b) contacting said exposed layer for a period of about from 2 seconds to 5 minutes with an unexposed fine grain silver chlorobromide negative film wetted with a solvent transfer developer comprising sodium thiosulfate and hydroquinone.

12. A copper plate having a silver image thereon produced in accordance with the process of claim 5.

13. A copper plate having a silver image thereon produced in accordance with claim 11.

14. A photographic element comprising a copper surface having thereon a silver image obtained by contacting an exposed photosensitive layer comprising ferric nitrate and potassium bromide with a physical developing solution containing a silver salt and a silver halide developing agent.

No references cited.

NORMAN G. TORCHIN, *Primary Examiner.*

J. R. EVERETT, *Assistant Examiner.*